(12) United States Patent
Brunner et al.

(10) Patent No.: US 8,723,198 B2
(45) Date of Patent: May 13, 2014

(54) WAVELENGTH-CONVERTING CONVERTER MATERIAL, LIGHT-EMITTING OPTICAL COMPONENT, AND METHOD FOR THE PRODUCTION THEREOF

(75) Inventors: Herbert Brunner, Sinzing (DE); Klaus Höhn, Forchheim (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 1099 days.

(21) Appl. No.: 11/917,789

(22) PCT Filed: Jun. 7, 2006

(86) PCT No.: PCT/DE2006/000980
§ 371 (c)(1),
(2), (4) Date: Jan. 13, 2009

(87) PCT Pub. No.: WO2007/006246
PCT Pub. Date: Jan. 18, 2007

(65) Prior Publication Data
US 2009/0173957 A1    Jul. 9, 2009

(30) Foreign Application Priority Data

Jun. 23, 2005 (DE) .......................... 10 2005 029 258
Dec. 23, 2005 (DE) .......................... 10 2005 061 828

(51) Int. Cl.
*H01L 33/00* (2010.01)
(52) U.S. Cl.
USPC ..................................... 257/98; 257/E33.06

(58) Field of Classification Search
USPC ............................................. 257/98, E33.06
See application file for complete search history.

(56) References Cited

U.S. PATENT DOCUMENTS

| | | | |
|---|---|---|---|
| 5,637,258 A | 6/1997 | Goldburt et al. | |
| 6,113,807 A | 9/2000 | Yamaura et al. | |
| 6,160,040 A * | 12/2000 | Ghosh ........................... | 523/404 |
| 6,726,992 B1 * | 4/2004 | Yadav et al. ................... | 428/403 |
| 6,734,465 B1 | 5/2004 | Taskar et al. | |
| 7,045,956 B2 | 5/2006 | Braune et al. | |
| 2002/0192477 A1 | 12/2002 | Honda et al. | |
| 2003/0227249 A1 | 12/2003 | Mueller et al. | |
| 2004/0094757 A1 | 5/2004 | Braune et al. | |
| 2005/0129957 A1 | 6/2005 | Kashiwagi et al. | |
| 2007/0024173 A1 | 2/2007 | Braune | |

FOREIGN PATENT DOCUMENTS

CN            2567782            8/2003
(Continued)

OTHER PUBLICATIONS

"Representation of results of particle size analysis", ISO 9276-1, pp. 1-12 (2001).

(Continued)

*Primary Examiner* — Matthew Reames
(74) *Attorney, Agent, or Firm* — Fish & Richardson P.C.

(57) ABSTRACT

Disclosed is a wavelength-converting converter material comprising at least one wavelength-converting phosphor comprising phosphor particles, wherein a portion of said phosphor or all of said phosphor is present in the form of nanoparticles. Also disclosed is a light-emitting optical component comprising such a converter material and a method for producing such components.

30 Claims, 6 Drawing Sheets

(56) References Cited

FOREIGN PATENT DOCUMENTS

| | | | |
|---|---|---|---|
| DE | 103 16 769 | 10/2001 | |
| EP | 1 227 139 | 7/2002 | ............. C09K 11/62 |
| EP | 1 369 935 | 12/2003 | ............. H01L 33/00 |
| JP | 2000-031548 | 1/2000 | |
| JP | 2002-510866 | 4/2002 | |
| JP | 2004-015063 | 1/2004 | |
| JP | 2004-071908 | 3/2004 | |
| JP | 2004-161808 | 6/2004 | |
| JP | 2004-295187 | 10/2004 | |
| JP | 2005-524737 | 8/2005 | |
| WO | WO 99/50916 | 10/1999 | |
| WO | WO 03/093393 | 11/2003 | ............. C09K 11/02 |
| WO | WO 2004/093203 | 10/2004 | |

OTHER PUBLICATIONS

"A show of lights in the interests of medicine" ("Leuchtspiele fur die Medizin"), Research, Das Bayer-Forschungsmagazin, No. 15, pp. 38-41.

Vanderline, William E. et al., "Microscopy at the nanoscale", *Proceedings of ISTFA 2004*, ASM International, Materials Park, Ohio, USA.

"Translation of the Notification of Reasons for Refusal (type I office action)", JP Pat. Appl. No. 2008-517308, issued on Feb. 17, 2012 (6 pages).

Korean Intellectual Property Office, "English translation of Notice of Allowance of Patent", KR Appl. No. 10-2008-7001514, mailed on Feb. 9, 2013 (2 pages).

"Translation of the Decision of Refusal", JP Patent Application No. 2008-517308, mailed on Nov. 16, 2012 (3pages).

\* cited by examiner

WAVELENGTH-CONVERTING CONVERTER MATERIAL, LIGHT-EMITTING OPTICAL COMPONENT, AND METHOD FOR THE PRODUCTION THEREOF

CROSS REFERENCE TO RELATED APPLICATIONS

This application is a continuation of and claims the benefit of priority of International Application No. PCT/DE2006/000980, filed Jun. 7, 2006, which claims priority to German Patent Application No. 10 2005 029 258.5, dated Jun. 23, 2005 and German Patent Application No. 10 2005 061 828.6, dated Dec. 23, 2005, the contents of which are incorporated herein by reference.

FIELD OF INVENTION

The subject matter of the present invention is a wavelength-converting converter material according to the preamble of claim 1, a light-emitting optical component comprising such a converter material, and a method for producing same.

BACKGROUND OF THE INVENTION

The document US 2004/0094757 discloses a prior art wavelength-converting reaction resin compound with which phosphor particles are admixed. The phosphor particles have particularly large diameters, their $d_{50}$ values, measured in $Q_3$, being provided as preferably between 10 μm inclusive and 20 μm inclusive. The $d_{50}$ value is to be understood as the median diameter determined on the basis of a distribution sum of the particles. "$Q_3$" here stands for the mass distribution sum or the volume distribution sum. When such large phosphor particles are used, a thixotropic agent is added to the reaction resin compound to prevent the particles from sedimenting in it.

SUMMARY OF THE INVENTION

In regard to conventional wavelength-converting reaction resin compounds, it is known that a higher fine-grained component made up of phosphor particles less than 1 μm in diameter leads to brightness reductions and processing problems during the preparation and production of the converter element.

A further known disadvantage of known wavelength-converting reaction resin compounds is that for processing reasons, the phosphor component in the reaction resin compound cannot be increased arbitrarily. If the phosphor concentration is too high, surface interactions between the phosphor particles may lead to turbidification of the wavelength-converting compound or to optical extinctions, and thus to brightness losses.

With conventional phosphors used in wavelength-converting reaction resin compounds, geometrically unfavorable shapes and geometries of the phosphor particles, for example splintered, edged and angular phosphor particles, cause losses in connection with the incoupling of light into and the outcoupling of light from the phosphor particles. This diminishes the quantum efficiency of light-emitting diode (LED) components in which the wavelength-converting reaction resin compound is used.

To obtain a commercially viable light output, together with high quality, from such LED components, the phosphors must not sediment in the reaction resins either during storage or during processing at elevated temperatures. High quality is to be understood in connection with LED components as, for example, a uniform illumination pattern with the tightest possible color space distributions, high and stable brightness and high color trueness. Finely dispersed, optically inactive sedimentation delaying agents, such as Aerosil, for example, are used to prevent sedimentation. These further contribute to brightness reduction in LED components with a wavelength-converting reaction resin compound.

Finally, in terms of the handling of phosphor particles, metering and abrasion problems may have to be dealt with in process engineering.

It is one object of the present invention to specify a wavelength-converting converter material that is improved over the prior art and is suitable particularly for use in an LED component, for example for encapsulating an LED chip. A further intention is to specify a light-emitting optoelectronic component comprising such a wavelength-converting converter material. A method for producing a light-emitting optoelectronic component and components produced according to such a method will also be specified.

This object is achieved with a wavelength-converting converter material according to claim 1 and via the subject matter of the other independent claims. Advantageous embodiments and preferred improvements are the subject matter of the respective dependent claims.

In the wavelength-converting converter material cited at the beginning hereof, a portion of the phosphor is present in the form of nanoparticles. Alternatively, the phosphor can also be present entirely in the form of nanoparticles. The converter material preferably comprises at least one polymer; particularly preferably, it is a polymer mass into which at least one phosphor is mixed. Additionally or alternatively, the converter material advantageously comprises an inorganic material that advantageously functions as a matrix material for the phosphor. This material is preferably inorganic glass, a ceramic material or a TCO (transparent conductive oxide) such as indium tin oxide (ITO) or zinc oxide (ZnO).

The nanoparticles preferably have a median diameter $d_{50}$ of less than or equal to 100 nm, said median diameter being determined on the basis of a volume or mass distribution sum ($Q_3$) of measured particle diameters. The particles are assumed for this purpose to have the shape of a sphere of constant diameter. The particle diameter can in principle be measured in nanoparticles by dynamic light scattering (the DLS method), for example. Alternatively, the median diameter $d_{50}$ is determined on the basis of a number distribution sum $Q_0$ of measured particle sizes. In this case, the particle sizes can usefully be measured directly, for example by taking films with a scanning electron microscope and applying the appropriate scale. Suitable imaging techniques in connection with the use of a scanning electron microscope are, for example, the FSEI technique (Forward Scattered Electron Imaging) or the STEM-in-SEM technique (Scanning Transmission Electron Microscopy). Such techniques are described, for example, in Proceedings of ISTFA 2004, "Microscopy at nanoscale," W. E. Vanderlinde et al., whose disclosure content is hereby incorporated by reference.

Further measurement methods that are suitable in principle for characterizing nanoparticles can be found in Table 1 below. Some of these measurement methods may be usable in particular cases for determining the distribution, shape and morphology of the phosphor in the form of nanoparticles. The methods are described in part in *Handbook of Microscopy[:] Application in Material[s] Science[,] Solid-State Physics and Chemistry*, VCH [publisher], Weinheim, N.Y., 1997. The concepts and terminologies of particle size characterization are set forth and explained in greater detail in ISO 9276-1, "Representation of results of particle size analysis."

TABLE 1

| Method | Acronym | Range of Resolution |
|---|---|---|
| Small Angle Neutron Scattering | SANS | 0.001-10 µm |
| Small Angle X-ray Scattering | SAXS | 0.001-31 µm |
| Differential Mobility Analysis (electrostatic classification) | DMA | 0.005-1 µm |
| Scanning Electron Microscopy | SEM | 0.02-10 µm |
| Transmission Electron Microscopy | TEM | 0.01-0.5 µm |
| Gas Adsorption Surface Area Analysis (Brunauer-Emmet-Teller) | BET | No limitation, specific area in g/m² |

The phosphor present in the form of nanoparticles particularly preferably has a median diameter $d_{50}$ of less than or equal to 50 nm or less than or equal to 30 nm and greater than or equal to 1 nm.

The primary particles of the phosphor present in the form of nanoparticles particularly advantageously each have a size of, for example, less than or equal to 100 nm, preferably less than or equal to 50 nm, particularly preferably less than or equal to 30 nm.

Compared to conventional phosphor particles used in light-emitting optical components, phosphor particles that are in the form of nanoparticles serve to create an improved, uniform illumination pattern.

According to a particularly advantageous embodiment, the nanoparticles in the polymer mass are at least partially aggregated into agglomerates. In particular, the nanoparticles are deliberately aggregated into agglomerates. The agglomerates preferably have a $d_{50}$ value, measured in $Q_3$ or $Q_0$, that is greater than or equal to 1 nm and less than or equal to 100 nm. In such small agglomerates, therefore, both the primary particles and the coalesced agglomerates are nanoparticles.

In connection with phosphor particles, every effort is usually made to keep agglomerates from forming. Especially in the case of particularly large phosphor particles, for example more than 5 µm in size, agglomerate formation detracts from the uniformity of the converted light. The formation of agglomerates of primary phosphor particles may also result in a lower conversion efficiency, for example due to the reabsorption of converted radiation.

In conjunction with the present invention, it has surprisingly been found that the deliberate creation of small-diameter agglomerates composed of or containing nanoparticles can be advantageous for the conversion efficiency and/or the radiation characteristic of converted radiation. Using phosphors in the form of nanoparticles, it is possible, by deliberately forming agglomerates, to fabricate conversion elements that have a more uniform radiation characteristic for converted radiation than conventional conversion elements. In particular, the scattering particles are colorless and transparent.

According to one advantageous embodiment, the wavelength-converting converter material is free of optically inactive sedimentation delaying agents or thixotropic agents. Using a phosphor that is present at least partially in the form of nanoparticles significantly reduces the risk of sedimentation of the phosphor particles.

According to another advantageous embodiment, the wavelength-converting converter material comprises at least two different phosphors. These phosphors are preferably suitable for generating white, i.e. substantially colorless, light by the superimposition of their emitted spectra. In addition, light with high color trueness, i.e., high color rendering, can be generated with such phosphors. The color rendering index CRI of the light generated with such phosphors is advantageously greater than or equal to 70, preferably greater than or equal to 80.

The at least two phosphors are advantageously present at least partially in the form of nanoparticles. Alternatively, it is advantageously provided that only one of the phosphors is present at least partially in the form of nanoparticles. In these cases, the phosphors present in the form of nanoparticles can serve, for example, as an optically active thixotropic agent or as a sedimentation delaying agent for other, potentially much larger phosphor particles present in the converter material.

In a preferred embodiment, the phosphor additionally comprises phosphor particles having a $d_{50}$ value, measured in $Q_3$, of greater than or equal to 0.1 µm and less than or equal to 25 µm, or the converter material comprises an additional phosphor having such phosphor particles. Particularly preferably, these additional phosphor particles have a $d_{50}$ value of greater than or equal to 1 µm, particularly of at least 5 µm. Additionally or alternatively, it is preferable if the additional phosphor particles have a $d_{50}$ value of less than or equal to 20 µm. It is understood that in the context of the present invention, the $d_{50}$ value is preferably measured in $Q_3$, i.e., determined on the basis of a mass distribution sum or a volume distribution sum. Alternatively, the median diameter $d_{50}$ is determined on the basis of a number distribution sum $Q_0$.

With a phosphor that is present at least partially in the form of nanoparticles, it is possible to create advantageously reproducible phosphor particles or phosphor pigment distributions that are as free from foreign phases as possible and that have reproducible particle shapes or pigment shapes.

According to a further advantageous embodiment, the converter material comprises at least one inorganic phosphor in the form of nanoparticles and at least one organic phosphor. Soluble or dissolved organic phosphors are particularly suitable for combination with inorganic phosphors in the form of nanoparticles.

The converter material usefully contains optically non-excitable scattering particles having a $d_{50}$, measured in $Q_3$ or $Q_0$, of greater than or equal to 100 nm and less than or equal to 10 µm. The uniformity of the light emitted by the converter material can be deliberately influenced further in this way, which is especially important in connection with phosphors in the form of nanoparticles because they have weak scattering properties.

The phosphor present in the form of nanoparticles advantageously contains like particles having the same constituents as a host lattice material or having the same host lattice material, said like particles comprising at least one activator having different activator concentrations. The activator concentration of a first portion of the like particles is preferably between 0.1 Atom % inclusive and 3 Atom % inclusive, and the activator concentration of a second portion of the like particles is preferably between 3 Atom % and 10 Atom % inclusive. By using different activator concentrations, it is possible to influence emission properties of the phosphors present in the form of nanoparticles.

The concentration of the phosphor in the wavelength-converting converter material is preferably no more than 80 wt %, particularly preferably no more than 60 wt %.

According to an alternative embodiment, the ratio of phosphor in the converter material is between 60 wt % inclusive and 80 wt % inclusive. Such high phosphor concentrations can be advantageous for example in the production of LED chips provided with a wavelength-converting layer.

The wavelength-converting converter material usefully comprises at least one of the materials epoxy casting resin, epoxy resin molding compound, acrylate, silicone and thermoplastic.

The converter material preferably comprises at least one hybrid material that contains silicone and at least one of the materials epoxy resin and acrylate. By mixing or otherwise combining different materials within a hybrid material, for example a refractive index of the hybrid material can be deliberately adjusted so as to be able to match the refractive indexes of the phosphor and of the phosphor-surrounding matrix material of the converter material to each other. With hybrid materials it is possible to combine the positive properties of different materials. For example, disadvantageous properties of a material can be attenuated or eliminated in this way.

According to one advantageous embodiment, the converter material comprises at least one thermoplastic from the group consisting of poly-N-methylmethacrylimide (PMMI), polycarbonates (PC), polyamides (PA), polystyrene (PS), and cycloolefinic polymers (COP) and copolymers (COC).

Additionally or alternatively, the converter material comprises at least one addition-crosslinking silicone that preferably cures thermally or photonically, i.e. under the effect of electromagnetic radiation. The photonically curing material preferably cures under the effect of electromagnetic radiation in the UV region.

The converter material preferably contains inorganic phosphor particles. The phosphor particularly advantageously contains at least phosphor particles from the group of rare-earth-doped garnets, rare-earth-doped thiogallates, rare-earth-doped aluminates or rare-earth-doped orthosilicates. Additionally or alternatively, the phosphor preferably comprises phosphor particles composed of oxide host lattices, such as $Y_2O_3$, $Gd_2O_3$, $La_2O_3$, $Pr_2O_3$, $ZrO_2$, $TiO_2$, $ZnO$, $ZnGa_2O_4$. These phosphor particles advantageously comprise as activator at least one element from the group consisting of the rare earths, Mn, Ag and Cr.

In phosphors having a host lattice and activator atoms, the activator concentration is advantageously less than or equal to 10 Atom %, preferably less than or equal to 5 Atom %. This is also true, advantageously, when like phosphor particles having different activator concentrations are present. Alternatively, however, it may be advantageous, particularly with phosphors in the form of nanoparticles, if the concentration of activator atoms is greater than 10 Atom %, for example greater than or equal to 15 Atom %.

The phosphor particles generally preferably comprise, as activator ions, elements of the lanthanide series, manganese, chromium, silver or uranyl.

According to another embodiment, at least one phosphor is present that has a host lattice in which two different elements are simultaneously present as activators. Particularly preferably, this phosphor is present at least partially in the form of nanoparticles. The simultaneous presence of two different activators in the same host lattice can also, however, be advantageous regardless of the size of the phosphor particles, i.e., in a wavelength-converting converter material comprising such a phosphor, it is not absolutely necessary for some or all of the phosphor to be present in the form of nanoparticles.

In another advantageous embodiment, the converter material comprises at least one reaction resin that contains as an epoxy casting resin formulation at least one storage-stable curing agent formulation. The curing agent formulation preferably comprises one or more of the substances carboxylic acid anhydrides with acid esters (carboxylic acid anhydride half esters), flexibilizers, organic phosphorus compounds, initiators and accelerators. Particularly preferably, the curing agent formulation comprises at least one complex compound of the colorless $Zn^{2+}$ ion as an accelerator, said complex compound advantageously comprising organic ion ligands. Zinc octoate is particularly advantageously present as an accelerator. The zinc octoate or the complex compound of the colorless $Zn^{2+}$ ion preferably has a $Zn^{2+}$ content greater than or equal to 21 wt %. The $Zn^{2+}$ content of the complex compound of the colorless $Zn^{2+}$ ion is usefully more than 10 wt %, advantageously more than 20 wt %.

According to an advantageous embodiment, the converter material is present partially or entirely as a layer. A layer is preferably to be understood in this context as a body whose areal extent and whose thickness perpendicular to the local direction of extent are much smaller than its overall extent. The areal extent of the layer particularly preferably is planar. Also particularly preferably, the thickness of the layer is largely or completely constant. Edge regions or defined regions in the interior of the layer can also advantageously have a smaller thickness than the other regions of the layer. By implementing this type of measure, a particularly uniform radiation characteristic can be obtained in connection with a light-emitting optoelectronic component, with minimal variations in color space as a function of emission angle.

The layer particularly advantageously has a thickness of less than or equal to 50 μm. An even lower upper limit for the thickness of the layer may be advantageous in some applications. Correspondingly, according to another advantageous embodiment, the layer has a thickness of less than or equal to 5 μm.

It may be particularly advantageous if the converter material is present as a film. In the production of light-emitting optical components, it is possible to make the converter material as film independently from the rest of the component and, for example, apply it to a radiation source. This is technically easy to execute and permits high reproducibility as well as precise adjustment of the resulting color space of a light emitted by the component.

The light-emitting optical component comprises a radiation source and a wavelength-converting converter material that serves to convert an electromagnetic radiation emitted by the radiation source partially or completely into radiation having an altered wavelength. The component is particularly preferably suitable for general lighting applications, i.e., particularly for the lighting of spaces in buildings and out of doors. The use of phosphors in the form of nanoparticles permits very precise adjustment of the color space of the light emitted by the optical component, which is especially advantageous for general lighting. Combining suitable phosphors therefore makes it possible to deliberately set up not only a well-defined color space, but also very good and well-defined color rendering of the light-emitting component.

The light source advantageously comprises an organic LED, particularly an organic light-emitting diode (OLED). The organic LED is provided with or comprises the converter material, said converter material being present partially or entirely as a layer.

Additionally or alternatively, the light source comprises an LED chip. The LED chip is provided with the converter material, said converter material being present partially or entirely as a layer.

In another embodiment, the radiation source in the component is operated in pulse mode and/or the component is intended for optical switching processes. Phosphors in the form of nanoparticles have shorter response and decay times than phosphors that are in the form of distinctly larger particles. As a result, such phosphors advantageously are also suitable in principle for pulse-mode operation or/or [sic] for switching processes having short switching times.

A method for producing a light-emitting optical component is specified. In the method, an electromagnetic radiation source is prepared and is provided with a wavelength-converting converter material. The converter material comprises at least one wavelength-converting phosphor, which is present at least partially in the form of nanoparticles. The converter material is preferably partially or entirely in the form of a layer with a thickness of less than or equal to 50 µm.

It is possible within the scope of the method to configure the converter material in layer form by means of a coating operation. Alternatively, a layer-shaped converter material can be prepared and applied to the radiation source. For this purpose, the converter material is present for example as a flexible film.

In a particularly advantageous embodiment of the method, at least a portion of the nanoparticles is prepared as at least one suspension in an organic solvent. The suspension is incorporated into starting components of the converter material, said starting components particularly being, for example, starting components of a matrix material that is to be produced, or a matrix material itself. The solvent is then removed from the converter material. The use of such a method makes it possible to incorporate the nanoparticles into the converter material in controlled fashion. Undesirable sedimentation can be largely prevented in this way. The deliberation formation of agglomerates from the nanoparticles can also be brought about.

The phosphor nanoparticles are advantageously present in the solvent in a concentration of up to 90 wt %.

The solvent usefully comprises at least one of the substances alcohol, glycol ether, tetrahydrofuran (THF), dioxane and ethyl acetate (EtAc).

In addition, it is usefully provided to use to incorporate the suspension at least one of the classes of substances wetting agents, adhesion promoters and glycol ethers.

In a further embodiment of the method, at least a portion of the converter material is prepared as at least one suspension of at least a portion of the phosphor in a solvent, and the suspension is applied to the radiation source. A suspension means in this context a substance comprising, in addition to the solid phosphor, at least one other substance that contains the solvent and is present in a fluid phase, that is, a suspension is a substance containing both solid and fluid phases. The suspension can advantageously be present as a gel, a sol or a colloidal solution. The suspension is also advantageously low-viscosity or high-viscosity. "Low viscosity" is to be understood as a viscosity of up to about 500 mPas, particularly up to 200 mPas. "High viscosity" is to be understood as a viscosity of approximately 500 mPas or more, particularly of 1000, 10,000 or even 100,000 mPas or more.

The solvent can advantageously be water or an organic solvent. The organic solvent usefully comprises at least one of the substances alcohol, glycol ether, tetrahydrofuran (THF), dioxane and ethyl acetate (EtAc).

The suspension can contain other additives. An adhesion promoter is advantageously present as an additive. Additionally or alternatively, a deaerator is present in the suspension. As a further additional or alternative additive, the suspension advantageously comprises at least one flow additive. According to one useful embodiment, a filler, such as Aerosil, for example, can also be present additionally or alternatively. The filler is preferably finely to ultrafinely dispersed. A finely dispersed filler contains particles with a specific surface of greater than or equal to 10 $m^2/g$ and an ultrafinely dispersed filler contains particles with a specific surface of greater than or equal to 100 $m^2/g$, the specific surface being determined in each case by BET.

The application of a luminescence conversion material present as a suspension is advantageously performed by means of a dispenser having a metering valve (dispensing), via a printing process, and/or by spin coating. Said application is preferably performed via an inkjet printing process.

It is possible by means of the method to set a color space of the component with high precision and high reproducibility. Light-emitting optical components are specified that are produced according to the method and in regard to which the light emitted in a main radiation direction is provided to occupy the same color space in the CIE color diagram. This color space of the light-emitting optical elements is precisely adjusted such that the values of the x and y coordinates of the resulting color spaces are within an interval of 0.006 or less with a statistical certainty of at least 95%. The values of the x and y coordinates of the resulting color spaces are preferably within an interval of 0.004 or less, particularly preferably of 0.002 or less, with a statistical certainty of at least 95%.

The light-emitting optical component comprises a wavelength-converting converter material that includes one or more of the previously cited features.

DESCRIPTION OF THE DRAWINGS

Further advantages, preferred embodiments and improvements of the wavelength-converting converter material and of the light-emitting optical component will become apparent from the exemplary embodiments explained below in connection with the figures. Therein.

In the various figures, like and like-acting elements are always denoted by the same reference characters.

DETAILED DESCRIPTION OF THE PREFERRED EMBODIMENTS

Figure 1:
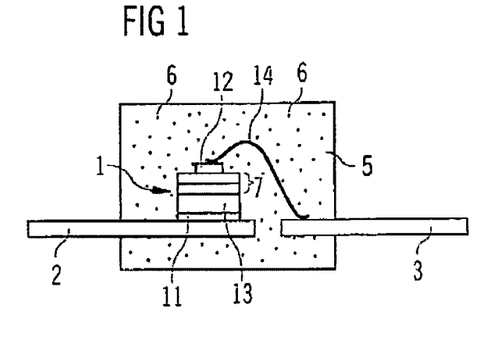
FIG. 1 is a schematic sectional view of a first light-emitting optoelectronic component comprising a wavelength-converting converter material.

The light-emitting semiconductor component of FIG. 1 comprises a wavelength-converting converter material according to the invention. This contains at least one transparent, i.e. radiation-pervious, preferably non-yellowing and particularly hydrolysis- and temperature-resistant polymer.

The component comprises a semiconductor body 1, e.g. an LED chip. This is attached by its rear-side contact 11 to a first electrical lead 2 of a leadframe via an electrically conductive connecting means 7.

The semiconductor body 1 comprises an active layer or layer sequence 7 having one layer or a plurality of layers based on $In_xGa_yAl_{1-x-y}N$, where $0 \le x \le 1$, $0 \le y \le 1$ and $x+y \le 1$. The layer or layer sequence 7 has, for example, a multi-quantum well structure. The LED chip includes, for example, a substrate 13. Alternatively, it can also be free of substrate.

Used as the electrical connecting means is, for example, a metallic solder, particularly soft solder, or a glue. The front-side contact 12 is connected via a bonding wire 14 to a second electrical lead 3 of the leadframe.

The free surfaces of the semiconductor body 1 and subregions of the electrical leads 2 and 3 are directly surrounded by the converter material 5.

The converter material is, for example, a cured wavelength-converting reaction resin compound, i.e., it comprises a reaction resin compound as polymer. Suitable materials for this purpose are, for example, epoxy resin and, additionally or alternatively, at least one acrylate.

The polymer of converter material 5 can also be a polymer hybrid material: Candidate hybrid materials include, for example, silicone-modified epoxy resins, which age less under exposure to ultraviolet light than conventional epoxy resins but basically have the other favorable physical properties of conventional epoxy resins. It is also possible to mix together at least one epoxy resin and at least one silicone. Examples of such suitable hybrid materials are recited for example in US 2002/0192477 A1 or US 2005/0129957 A1, whose disclosure content in this regard is hereby incorporated by reference. It is also possible to combine silicone with acrylate or to combine silicone with acrylate and epoxy resin.

The converter material 5 advantageously comprises a multi-component resin formulation, for example a two-component epoxy resin. In addition to phosphor particles, this resin can additionally be admixed with at least one of the substances glycol ether and/or glycol monoether at ≤3 wt %, silane adhesion promoters at ≤3 wt %, and silicone-based wetting agents at ≤1 wt %. For example, diethylene glycol monomethyl ether is admixed at ≤2 wt % and Tegopren 6875-45 at ≤2 wt %. The wt % figures are referred to the A component of the polymer or epoxy resin.

Reaction resins, as epoxy casting resin formulations used for the converter material 5, are preferably storage-stable and for this purpose contain, for example, curing agent formulations. Suitable as constituents of the curing agent formulation are carboxylic acid anhydrides containing acid esters (carboxylic acid anhydride half-esters), flexibilizers, organic phosphorus compounds, initiators and/or accelerators. Colorless $Zn^{2+}$ derivatives can be present as accelerators; particularly preferably, the curing agent formulation comprises zinc octoate as accelerator, e.g. in a concentration of 10 wt % or 24 wt %. As an alternative to zinc octoate, another complex compound of $Zn^{2+}$ can be used as accelerator. The complex compound contains for example organic ion ligands, for example based on carboxylic acids or alcohols. Different types of ligands can also be present in a complex compound. Examples of carboxylic acid based ligands are stearate, palmitate and laurate. Examples of alcoholates are long-chain alcoholates based on, for example, butanol, hexanol or octanol.

The curing agent formulation for the epoxy casting resin compound is storable for at least 3 months. The epoxy casting resin compound is a multi-component potting compound, particularly a two-component epoxy casting resin compound having an A component and a B component.

In the production of conversion material, it is generally advantageous to use polymer components in which the phosphor particles are embedded and which are storable, with the incorporated phosphors, for at least 3 months at room temperature. Alternatively, for example an inorganic material such as silicon dioxide is used as a matrix material. For particular applications it may also be advantageous to use an electrically conductive matrix material, such as a TCO, for example ZnO or ITO, as matrix material.

The converter material can also comprise at least one silicone, which is preferably thermally curing and particularly preferably addition-crosslinking. Suitable further alternative or additional polymers are, for example, thermoplastics such as PMMI, PC, PA, PS, COP, COC or TPX. In addition, PMMA, which in particular can readily be admixed with organic phosphor molecules, can be used in addition to or alternatively to the above-cited polymers.

The processing of compounds, particularly epoxy resin and/or silicone compounds, with which the phosphor particles are admixed is preferably done via cast-resin technology or molding technology or by coating. The processing is done at a temperature of no less than 80° C., preferably at a temperature above 120° C. This is advantageous for efficient and economical production of the converter material.

In order to produce stable and homogeneous batches of reaction resin and silicone, for example wetting agents, deaerators and/or additional processing agents are added.

The converter material 5 comprises phosphor particles. Particles of Ce-doped garnet material (for example YAG:Ce) are preferably present in a concentration of between 1 wt % inclusive and 30 wt % inclusive. The phosphor particles 6 are present in the form of nanoparticles having a $d_{50}$ value for example of less than 25 nm, e.g. of 15 nm.

The phosphor comprises, for example, in addition to the nanoparticles, still other phosphor particles 6 with an average diameter of between 10 µm and 20 µm or between 1 µm and 20 µm.

As mentioned above, the converter material can comprise phosphor particles made from oxidic garnet material, preferably doped with Ce. Alternatively or in addition to the oxide-based garnet material, phosphor particles with host lattices based on silicate, sulfate, sulfide, phosphate or nitride can also be present, phosphor particles based on nitride being preferred.

In addition, the host lattice of the phosphor can be doped with various activator ions, for example with europium (red emission spectrum), terbium (yellow-green emission spectrum), with chromium, Mn or with uranyl ions. In particular, the phosphor particles present in the form of nanoparticles preferably have oxidic host lattices, such as, for example, the above-mentioned garnet crystal structures or spinel crystal structures.

In one example, the phosphor comprises nanoparticles with a host lattice of yttrium-aluminum-garnet, doped with cerium as activator. One portion of these nanoparticles has a cerium concentration of, for example, approximately 2 Atom % and another portion has a cerium concentration of, for example, approximately 5 Atom %.

In a further example, the phosphor comprises particles with a host lattice that contains at least two different activators. Atoms that have similar ionic radii when operating as activators are preferably used for this purpose. The ions also have the same charges, for example, although this is not strictly necessary. For example, starting with a phosphor that has a trivalent ion as activator, it is theoretically possible to replace two of these activators in each case with three divalent ions, thereby also obtaining a balanced charge in the phosphor. One example is an yttrium aluminum garnet, e.g. with $Y_3Al_5O_{12}$ as the host lattice, containing both Ce and Cr as activators.

In general, both organic and inorganic additional phosphors can be added to the phosphors that are in the form of nanoparticles.

One example of green-, yellow- and red-emitting organic phosphors is perylene-based dye molecules. Components emitting in the UV, the visible or the infrared can also be produced by admixing 4f metalorganic compounds. In particular, red-emitting components can be obtained for example by admixing $Eu^{3+}$-based metalorganic chelates. Infrared-emitting components, especially comprising blue-light-emitting semiconductor bodies, can be produced by admixing 4f chelates or $Ti^{3+}$-doped sapphire.

Suitable organic phosphors for a white-light-emitting semiconductor component according to the invention are perylene phosphors, such as for example BASF Lumogen F 083 for green luminescence, BASF Lumogen F 240 for yellow luminescence, and BASF Lumogen F 300 for red luminescence. These dyes can easily be added for example to transparent epoxy resin or to a polymer hybrid material. In combination with at least one inorganic phosphor in the form of nanoparticles, they can exert a particularly advantageous effect.

A white-light-emitting component can advantageously be produced by selecting the phosphor such that a blue radiation emitted by the light source is converted to complementary wavelength ranges, particularly blue and yellow, or to additive color triplets, e.g. blue, green and red. In this case, the yellow light or the green and red light is generated by the phosphors. The hue (the color space in the CIE color chart) of the white light generated in this way can be varied by a suitable choice of dye(s) in terms of mixture and concentration.

Possible production methods and preferred configurations of method steps for producing the phosphors present in the form of nanoparticles are described below. The phosphors are produced, for example, in a sol-gel process, in an epitaxial process (e.g. solvent evaporation epitaxy), by particular sputtering techniques (e.g. radiofrequency magnetron sputtering), via hydrothermal syntheses, or by precipitation processes in an aqueous medium.

The precipitation processes in an aqueous medium can take place with or without calcination, calcination in this context preferably taking place at a temperature above 500° C.

In sol-gel processes, precursor compounds of the elements needed for the phosphor nanoparticles are prepared at high dilution in a solution. The proportion of phosphor nanoparticles is, for example, 5 wt %. Alternatively, higher concentrations are also possible, for example 85 wt %.

The solution preferably contains at least one alcohol as solvent. It is, for example, usefully acidified with acetic acid and mixed with water. The solution is then precipitated by hydrolysis, for example in an alkaline medium, under controlled time and temperature conditions. The particles so produced are then washed and dried. They can be annealed at a temperature preferably above 500° C.

The size, distribution, shape and morphology of the phosphor particles produced by such a sol-gel process depends—greatly, in some cases—on various parameters. Such parameters include the degree of dilution of the solution, the chosen pH value, the choice of temperature and duration for the precipitation reaction, and the purity of the starting components and the solvent. Water that is highly purified of $CO_2$ and ions is preferably used.

The precursor compounds react with one another in the solution in dependence on the concentration, the pH value and the temperature of the solution, and form the phosphor particles in a kind of condensation reaction. The phosphor particles can then be treated and dried, for example by means of an annealing process and/or a current of air.

The above parameters, such as the degree of dilution of the solution, the pH values, the choice of temperature and duration for the precipitation reaction, and the purity of the starting components and solvent, can also be used to at least partially control the formation of agglomerates.

Treatment in an annealing process and/or with a current of air also affords opportunities to deliberately influence agglomerate formation. Agglomerates can be largely prevented from forming through the use of an annealing process and a current of air. However, the deliberate formation of agglomerates can also be influenced, for example by the choice of temperature and duration and the course of the annealing process, or by the nature, intensity and temperature of the air jet.

Agglomerate formation can also be deliberately controlled by incorporating the phosphor particles into a matrix material. If the particles are incorporated for example into an A component of a potting compound, this preferably takes place under vigorous mixing and stirring of the compound. The less vigorously the compound is stirred and mixed, the greater the number and size of the agglomerates that are able to form. Important factors in this regard are the stirring rate and the force applied during mixing. The above-described sol-gel method can be used, for example, to produce phosphor particles that contain a metal oxide and are activated with rare-earth metals. The phosphor particles are particularly producible in the form of nanoparticles. The precursor compounds of the host lattice elements and activator elements of the phosphor to be produced are prepared in an n-butoxide/butanol solution, which subsequently undergoes acetolysis to change the pH value of the solution from basic to acidic.

Such a process serves, for example, to produce yttrium oxide ($Y_2O_3$) that is activated with at least one rare-earth metal. Suitable rare-earth metals are, for example, europium, terbium, thulium, cerium, gadolinium and/or erbium.

Alternatively, the precursor solution that is prepared can also be an aqueous solution containing metal nitrates, the metals being the respective constituents of the phosphor particles to be produced. Such an aqueous solution can be used in particular to produce ceramic phosphor particles. To accomplish this, urea is added to the aqueous solution. The precursor solution is then heated. Suitable temperatures are, for example, between 80° C. inclusive and 130° C. inclusive. The higher the temperature, the larger the phosphor particles produced in this way. At a temperature of between 90° C. and 110° C., for example, $ZnGa_2O_4$ particles with an average particle size of between 15 nm and 18 nm can be produced.

Methods of the above-described kind are described for example in EP 1 227 139 A1 or U.S. Pat. No. 5,637,258, whose disclosure content is hereby incorporated by reference.

The phosphors present as nanoparticles are prepared as aqueous solutions, as suspensions, as sols or as gels, for example in or with organic solvents. The nanoparticles have concentrations of up to 98 wt % in these forms. Suitable organic solvents are, for example, alcohols, toluene, xylene, esters, aldehydes, ketones, DMF, DMSO, hydrocarbons or $CS_2$. Alternatively, the nanoparticles are prepared as a powder. With such forms as a starting point, the phosphor particles can in principle be incorporated into the converter material.

Alternatively, the above-cited suspensions, such as in particular the aqueous solutions, sols or gels, can be used as such, directly as converter material, and applied to the radiation source.

As described in the general part, the suspension may contain other additives. Examples of such additives are adhesion promoters, deaerators, flow additives, and/or fillers. The additives are used, for example, to impart a gel-like viscosity of between 10,000 and 20,000 mPas. Additionally or alternatively, the suspension can be thixotropic. Aerosil 200, for example, is used as filler.

The application of the luminescence conversion material present as a suspension is performed for example by means of a dispenser with a dosing valve (dispensing), by means of a printing process, preferably by means of an inkjet printing process, and/or by spin coating.

Dispensing and particularly also the use of an inkjet printing process are suitable for applying the suspension in small drops and to superimpose specific structures by way of the arrangement of the drops. A suitable method for the application of such drops is, in particular, the use of a DOD (drop on demand) printer. The structures are, for example, contiguous. Alternatively, the structures include a multiplicity of separate subregions provided with luminescence converter. These subregions are advantageously applied in orderly form, preferably in a matrix-like form or in a matrix.

Figure 2:
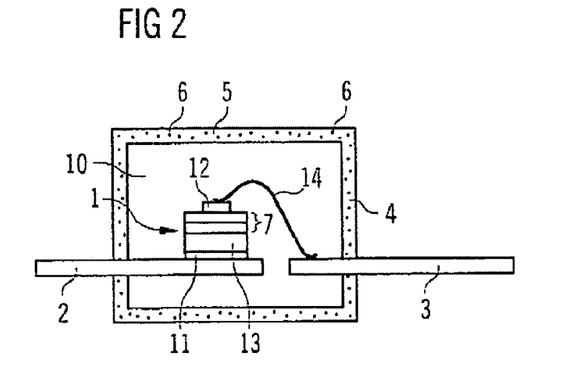
FIG. 2 is a schematic sectional view of a second light-emitting optical component comprising a wavelength-converting converter material.

The exemplary embodiment of a component according to the invention that is illustrated in FIG. 2 differs from that of FIG. 1 in that the semiconductor body 1 and subregions of the electrical leads 2 and 3, instead of being encased in a wavelength-converting reaction resin compound, are encased in a transparent or translucent envelope 10. This envelope 10 causes no change in the wavelength of the radiation emitted by the semiconductor body 1 and consists for example of an epoxy resin, silicone resin or acrylate resin commonly used in LED technology, or of another suitable material that is pervious to radiation, such as inorganic glass, for example.

Applied to this envelope 10 is a layer 4 consisting of or comprising a wavelength-converting converter material. The converter material can be constituted and obtained in the same way as in the first exemplary embodiment. As illustrated in FIG. 2, layer 4 covers the entire surface of the envelope 10. It is also possible for layer 4 to cover only a subregion of that surface. Layer 4 consists, for example, of a reaction resin compound based on a transparent epoxy resin and admixed with phosphor particles 6. A suitable reaction resin compound in this case is that described in connection with the first exemplary embodiment. Here again, YAG:Ce or YAG:Ce-based phosphors are preferably suitable for use as phosphor for a white-emitting semiconductor component.

Figure 3:
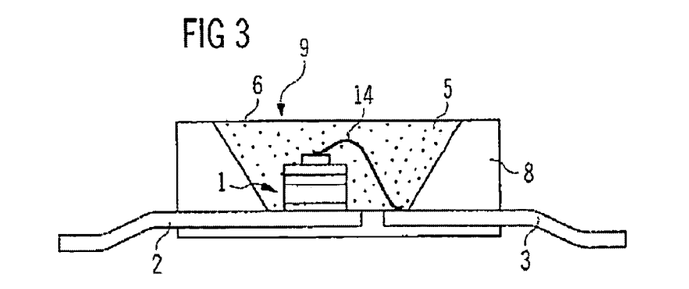
FIG. 3 is a schematic sectional view of a third light-emitting optical component comprising a wavelength-converting converter material.

In the component depicted in FIG. 3, the first and second electrical leads 2, 3 of a leadframe are embedded in a housing base body 8 comprising a recess 9. Recess 9 is filled with the previously described converter material 5.

The housing base body is preferably prefabricated of reflective plastic. The term "prefabricated" is to be understood as meaning that the housing base body 8 has already been preformed on the leads 2, 3, for example by injection molding or injection/compression molding, before the LED chip 1 is mounted on lead 2. Housing base body 8 consists, for example, of a plastic filled with white, reflective filler, and recess 9 is configured in terms of shape (for example by suitably coating the inner walls of the recess 9) as a reflector 17 for the radiation emitted by the semiconductor body during operation. Such housing base bodies 8 are used in particular in LED components that can be surface-mounted on printed circuit boards. Prior to the mounting of the semiconductor body 1, they are applied, for example by injection molding, to a leadframe comprising the electrical leads 2, 3.

Recess 9 is preferably at least partially filled with a reaction resin compound 5. An example of a reaction resin compound that is suitable for use in this case is that described in connection with the first exemplary embodiment.

Alternatively, the recess can be filled with transparent or translucent mass that performs no or a first wavelength conversion, and to which is applied a wavelength-converting layer corresponding to layer 4 from FIG. 2.

Figure 4:
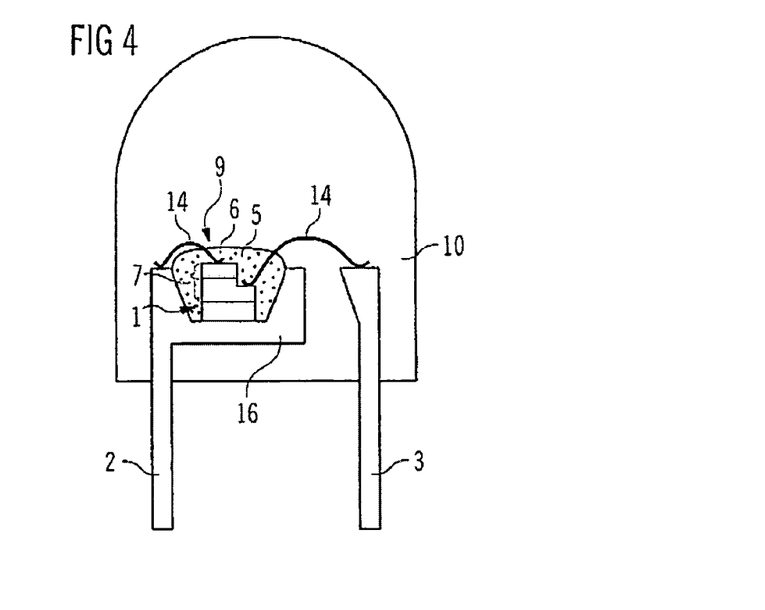
FIG. 4 is a schematic sectional view of a fourth light-emitting optical component comprising a wavelength-converting converter material.

Depicted in FIG. 4 is a so-called radial diode. Here, the radiation-emitting semiconductor body 1, for example an LED chip, is fastened, for example by soldering or gluing, in a portion 16 of the first electrical lead 2 that is configured as a reflector. Such housing designs are known in LED technology and thus need no further explication.

The free surfaces of the semiconductor body 1 are covered directly with a converter material 5 comprising phosphor particles 6, surrounded in turn by a further transparent envelope 10. Again, the converter materials described in connection with the first exemplary embodiment are suitable for use as the converter material in this case.

For the sake of completeness, it may be noted at this point that in the design shown in FIG. 4, analogously to the component according to FIG. 1, it is also feasible to use a one-piece envelope consisting of a converter material 5 comprising a cured reaction resin compound containing phosphor particles 6, or another converter material cited in connection with the exemplary embodiment illustrated in FIG. 1.

Figure 5:
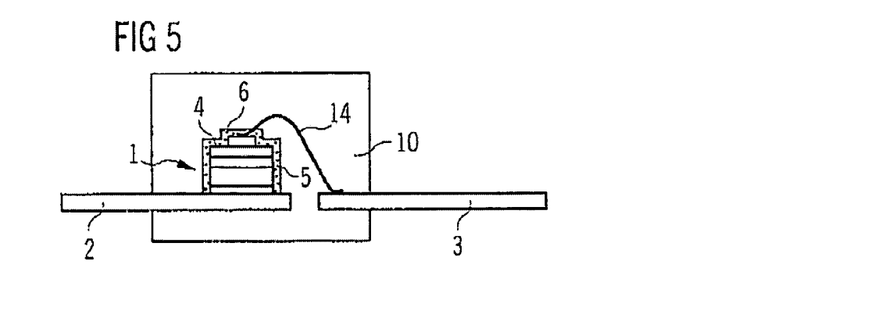
FIG. 5 is a schematic sectional view of a fifth light-emitting optical component comprising a wavelength-converting converter material.

In the exemplary embodiment of FIG. 5, a layer 4 composed of a wavelength-converting converter material is applied directly to the semiconductor body 1. The semiconductor body 1 and subregions of the electrical leads 2, 3 are encased in a further transparent envelope 10 that causes no change in the wavelength of the radiation passing through the layer 4 and is fabricated, for example, of a transparent epoxy resin usable in LED technology, or of glass. The conversion layer 4 can be obtained for example as described in connection with the second exemplary embodiment.

Figure 6:
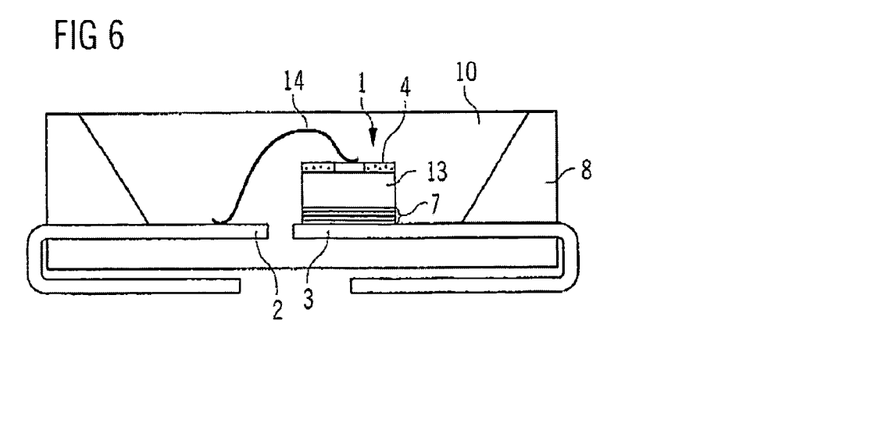
FIG. 6 is a schematic sectional view of a sixth light-emitting optical component comprising a wavelength-converting converter material.

Such semiconductor bodies 1 provided with a conversion layer 4 can be prefabricated and optionally incorporated into any of the housing designs known from LED technology (e.g. SMD housings, radial housings; see FIG. 4). The conversion layer 4 need not necessarily cover all of the free surface of the semiconductor body 1, but can also span only subregions of the semiconductor body. The conversion layer 4 can, for example, be applied to the semiconductor bodies directly on wafer, before the final singulation of the wafer into a multiplicity of semiconductor bodies. The conversion layer 4 preferably retains a constant thickness. In the exemplary embodiment described in FIG. 6, an upside-down (i.e., flip-chip-mounted) semiconductor body 1 in the form of an LED chip is attached to the leadframe 2, 3 inside a housing base body 8. The LED chip comprises a substrate 13 that is pervious to the radiation emitted by the active layer sequence 7, and that may be structured (not shown) for better radiation decoupling. Applied to the side of substrate 13 facing away from active layer sequence 7 is a conversion layer 4 composed of a wavelength-converting converter material and having substantially the same thickness throughout. Contrary to what is shown in FIG. 6, it may also be drawn over the lateral faces (flanks). This conversion layer was preferably applied to the semiconductor body 1 before the latter was mounted. Once the chip has been mounted in the recess of the housing base body, the latter is preferably encased in another plastic compound.

In the exemplary embodiments illustrated in FIGS. 5 and 6, the converter material comprises, for example, phosphors in a relatively high ratio of, for example, 75 wt % or 80 wt %. A ratio of 50 wt % or 55% is also possible alternatively here. Such high phosphor ratios are possible in principle within the scope of the invention regardless of the specific application.

In all the above-described components, in order to optimize the color impression of the emitted light and to adjust the radiation characteristic, the reaction resin compound 5, where applicable the transparent or translucent envelope 10, can comprise light-scattering particles, advantageously so-called diffusers. Examples of such diffusers are mineral fillers, particularly $CaF_2$, $TiO_2$, $SiO_2$, $CaCO_3$ or $BaSO_4$, or organic pigments. These materials can readily be admixed with reaction resins such as epoxy resins. They preferably have a $d_{50}$ value of greater than or equal to 100 nm.

The LED chips of the components are operated, for example, in pulse mode. In addition, the components can be used in devices in which optical switching processes are performed. Phosphors in the form of nanoparticles have shorter response and decay times than phosphors in the form of much larger particles. For this reason, such phosphors are also advantageously suitable in principle for pulse mode or for switching processes having short switching times.

In all the above-described components, the semiconductor body 1 can be a blue-light-emitting LED chip whose emission spectrum is below a wavelength of 520 nm. It is also possible for the radiation emitted by the LED chip to be partially or completely in the ultraviolet region. In general, the LED chip advantageously emits an electromagnetic radiation from the range between 360 nm inclusive and 500 nm inclusive.

In the case of a blue LED, the emitted radiation is preferably in a range between 440 m and 475 nm, within which the emission spectrum exhibits at least one local intensity maximum. The phosphor 6 (e.g. YAG:Ce) converts a portion of the radiation from the blue-emitting LED chip into yellow light, so the component as a whole emits white light.

In the previously described example, only a portion of the primary radiation emitted by the semiconductor body 1 is converted to a longer wavelength range so white light is produced as a mixed color. Alternatively two phosphors can be used, one of which produces red light and the other green light, in order collectively to yield the color white from three wavelength ranges (an additive color triplet of blue, green and red). It is possible in this case, for example, for only one of the phosphors to contain phosphor particles 6 in the form of nanoparticles. Alternatively, both kinds of phosphors may include nanoparticles. In addition to the nanoparticles, one or both of the phosphors may comprise larger phosphor particles having a $d_{50}$ value, measured in $Q_3$, of, for example, 8 μm or more. The fraction of phosphors present as nanoparticles then advantageously counteracts any sedimentation of the other phosphor fractions. It is also possible to convert all of the primary radiation by means of two or more phosphors in order to generate white light.

In addition to white light, one or more phosphors and their respective concentrations can also be so selected that any arbitrary color spaces in the CIE chart can in principle be obtained with the optical component. A primary radiation source other than a blue-emitting one can be used for this purpose, for example an LED chip that emits radiation in the UV region or in the green region.

With the components according to the invention, the CIE color space of the mixed light can easily be changed via the choice of phosphors and/or by varying the phosphor concentration(s) in the reaction resin compound or in the converter material. Deliberate and ultra-precise adjustment of the color space is particularly readily possible with phosphors present as nanoparticles, by means of which particularly thin polymer layers or glass layers can be produced. Due to the use of nanoparticles, despite thin conversion layers, the converted radiation will be susceptible to little or no loss of uniformity. The color space can be set by adjusting the thickness of the thin conversion layer, by the choice of phosphor concentrations and by combining different phosphors.

The described components are advantageously configured for example to meet quality standards in the automotive electronics industry.

In an exemplary method for producing the reaction resin compound, the phosphor particles present in the form of nanoparticles are first added to the converter material, and other phosphor particles having a $d_{50}$ value of for example 5 μm or more than 5 μm, for example 15 μm, are then mixed in.

Figure 7:
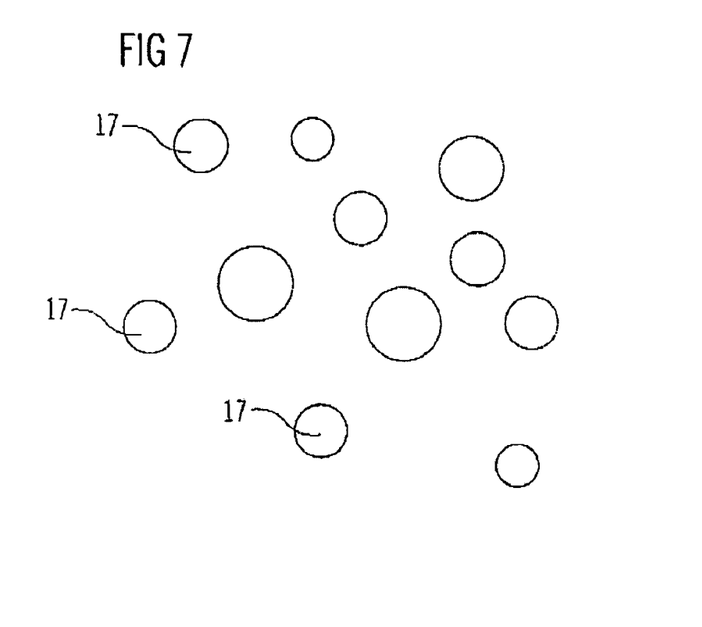
FIG. 7 is a schematic representation of a phosphor in the form of nanoparticles that are not agglomerated.

Nanoparticles 17 of one or more phosphors are illustrated by way of example in FIG. 7. The nanoparticles 17 shown are not agglomerated together, but rather each of the nanoparticles 17 is spaced apart from the others.

Figure 8:
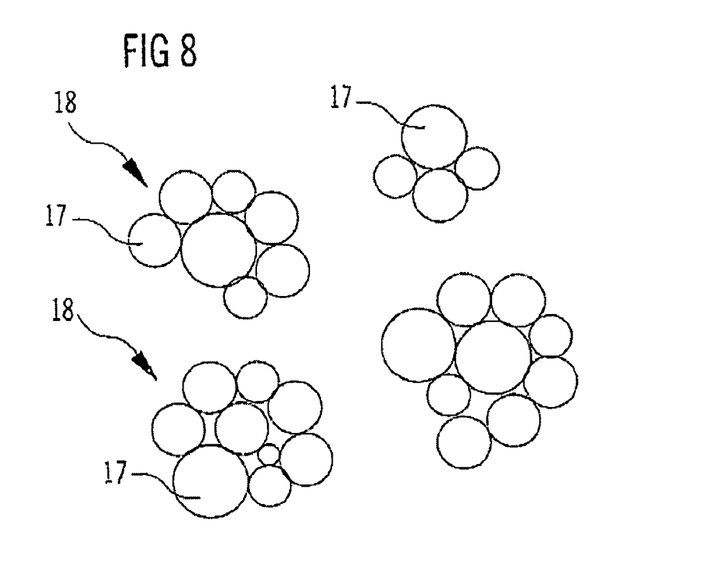
FIG. 8 is a schematic representation of a phosphor in the form of primary particles that are aggregated into agglomerates.

Alternatively, however, it is also advantageously possible to prepare the phosphor particles partially or completely deliberately in the form of agglomerates 18, as illustrated by way of example in FIG. 8. These agglomerates 18 are composed of at least two primary particles, said primary particles preferably being the nanoparticles 17 of the phosphor. The agglomerates 18 can also have a median diameter $d_{50}$ of less than or equal to 100 nm, said median diameter being determined on the basis of $Q_0$ or $Q_3$. For example, $d_{50}$ for the agglomerates is equal to 60 nm or 30 nm. The diameter is determined for example by measuring the volume of the agglomerates or a projected area of the agglomerates 18. Assuming that the agglomerates 18 are spherical, these values can then be used to determine the corresponding diameter.

The agglomerates 18 can each comprise phosphor particles of only one phosphor. However, it is also possible in principle for phosphor particles of a plurality of different phosphors to be aggregated into common agglomerates 18. This can be advantageous in creating a uniform color impression with light-emitting components comprising converter material.

Figure 9:
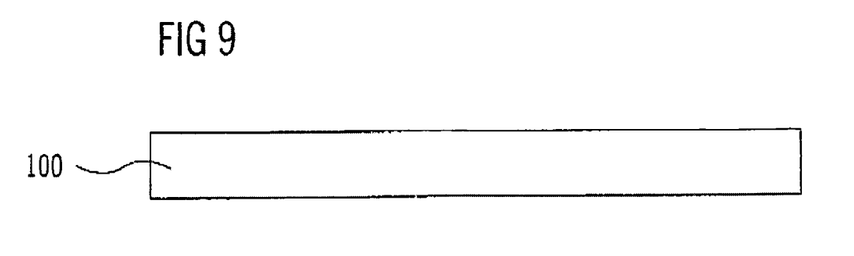
FIGS. 9 to 11 are schematic representations of different method stages of an exemplary embodiment of the method.
Figure 10:
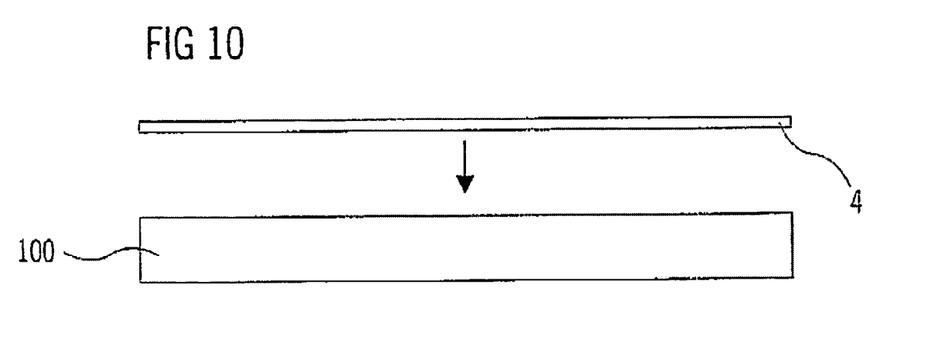
Figure 11:
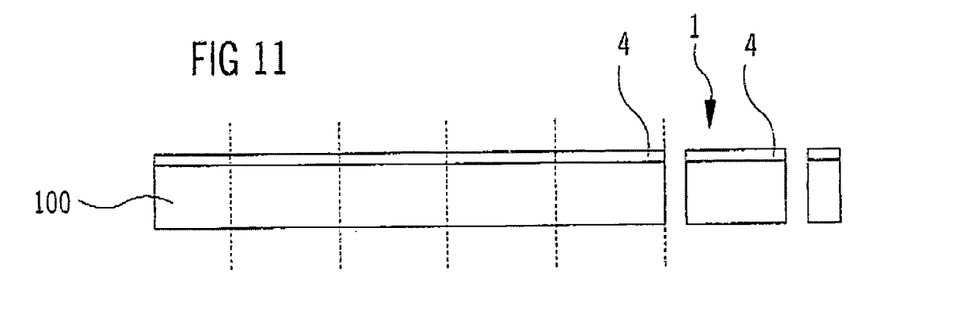

An exemplary method for producing a light-emitting optical component is illustrated in FIGS. 9 to 11. In the method, a layer composite 100 is prepared; see FIG. 9. The layer composite comprises a plurality of light-emitting structures, for example a plurality of LED structures in a common composite. Said layer composite 100 can, in particular, be a semiconductor wafer comprising an active layer or layer sequence suitable for emitting electromagnetic radiation.

A conversion layer 4 is also prepared as part of the method; see FIG. 10. The conversion layer 4 has, for example, a substantially constant thickness of about 40 μm. The conversion layer 4 is present for example in the form of a film, that is, it is in particular flexible. It comprises a suitable matrix material, for example a polymer mass, in which the phosphor particles are embedded. The prefabricated conversion layer 4 is applied for example with substantially full coverage to a main surface of the layer composite 100, as indicated by an arrow in FIG. 10. The conversion layer 4 can, for example, be glued or laminated onto the layer composite 100. In the case of lamination, an adhesion between the conversion layer 4 and the layer composite 100 is developed by the action of heat.

Before or after the conversion layer 4 is applied to the layer composite 100, the conversion layer 4 can optionally be structured. For example, the conversion layer can be provided with suitable holes, so that for example electrical lead areas of the layer composite 100 can be accessed through the applied conversion layer. In addition, suitable structuring of the conversion layer 4 can be used to deliberately adjust the resulting color impression and the radiation characteristic of the components to be produced. For this purpose, the conversion layer 4 can, for example, be structured such that each portion to which a respective semiconductor body is assigned comprises, in the outer regions, structures that result in a thinning or partial removal of the conversion layer.

The layer composite 100 is singulated into a plurality of semiconductor bodies 1. The conversion layer 4 is also singulated correspondingly into a plurality of parts. The layer composite 100 and the conversion layer 4 are preferably singulated jointly after the application of the conversion layer; see FIG. 11. Each singulated semiconductor body 1 thereby comprises a conversion layer 4.

Alternatively, it is also possible to singulate the layer composite 100 before the conversion layer 4. For example, the layer composite 100 is singulated into semiconductor bodies 1 before the conversion layer is applied. In this case, the conversion layer is applied to the singulated semiconductor bodies or the semiconductor bodies are applied to the conversion layer. This preferably takes place before the conversion layer 4 is singulated.

Each of the light-emitting optoelectronic components depicted in FIGS. 12 to 15 is an organic LED 20. Whereas each of the organic LEDs 20 depicted in FIGS. 12 to 15 has at least one phosphor integrated into the LED itself, FIG. 16 shows an example of an organic LED in which converter material is applied to an outer surface.

Each organic LED 20 comprises a substrate 21, to which, for example, a first electrode layer 23, an organic luminescing layer 24 and a second electrode layer 22 are applied. The electrode layers 22, 23 and the organic luminescing layer 24 are encapsulated by an encapsulant 25. In this regard, the exemplary embodiments depicted in FIGS. 15 and 16 constitute exceptions in which the first electrode layer 22 simultaneously functions as a substrate 21 and thus is not encapsulated by the encapsulant 25.

The organic luminescing layer 24 comprises organic molecules and/or polymers as active substances. Possible structures for organic LEDs and compositions of organic luminescing layers are widely known to those skilled in the art and thus will not be described in more detail here.

The structure of each of the LEDs illustrated in FIGS. 12 to 16 is to be understood as an exemplary structure of an organic LED. The principles described in the exemplary embodiments, in combination with the integration of phosphor particles, can naturally also be applied to LEDs having appreciably different structures, even if features of the LEDs illustrated in FIGS. 12 to 16 are not implemented or are implemented in a different manner.

Figure 12:
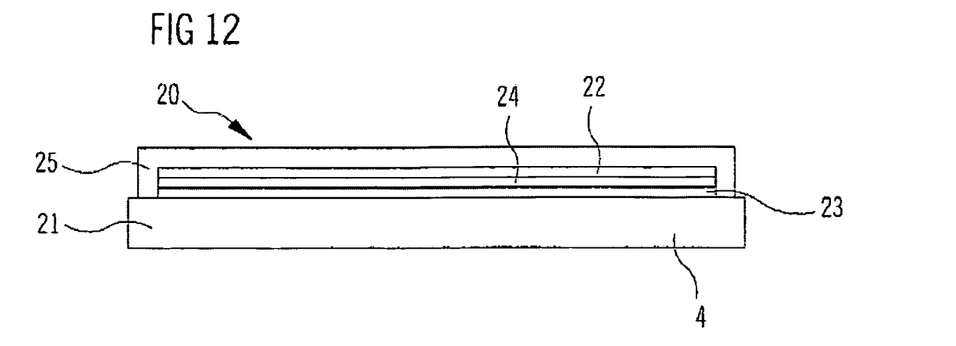
FIG. 12 is a schematic sectional view of a seventh light-emitting optical component comprising a wavelength-converting converter material.

In the exemplary embodiment illustrated in FIG. 12, the substrate 21 comprises phosphor particles. For example, the substrate 21 contains a conversion layer 4 or the entire substrate 21 is configured as a conversion layer 4. In this organic LED 20, an electromagnetic radiation generated in the organic layer 24 is transmitted through the substrate 21 and is partially or completely converted in the process.

Additionally or alternatively, it is also possible to integrate phosphor particles into other components of the organic LED 20. For example, the encapsulant 25 or the organic luminescing layer 24 may comprise phosphor particles. This is also possible in principle in the case of the electrode layers 22, 23, for example if they comprise an electrically conductive polymer.

It is further possible for the LED 20 to have at least two parts, with phosphor particles incorporated into each one. The parts of the LED comprise, for example, different phosphors or phosphor mixtures. For example, substrate 21 comprises a first type of phosphor and encapsulant 25 a second type of phosphor, such that the electromagnetic radiation generated in the organic layer 24 is converted in the encapsulant to light of a first wavelength range and in the substrate to light of a second wavelength range. Such an LED 20 can have two main emission sides, one on the side comprising the substrate 21 and another on the side comprising the encapsulant 25, differently colored light being emitted on each of the two main emission sides.

Figure 13:
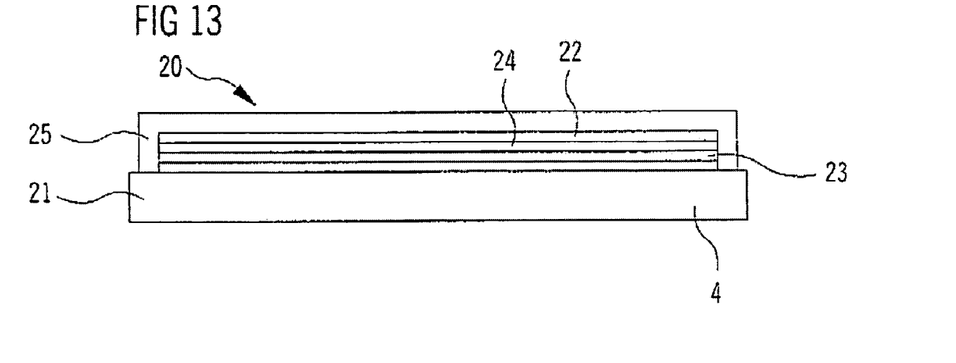
FIG. 13 is a schematic sectional view of an eighth light-emitting optical component comprising a wavelength-converting converter material.
Figure 14:
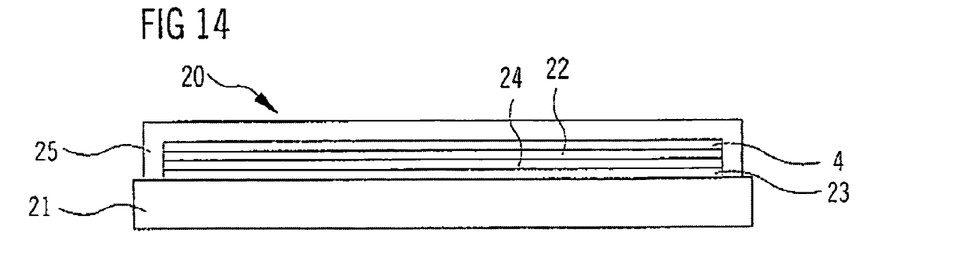
FIG. 14 is a schematic sectional view of a ninth light-emitting optical component comprising a wavelength-converting converter material.

The components illustrated in FIGS. 13, 14 and 16 are examples of organic LEDs 20 in which at least one conversion layer 4 is applied to the substrate 21. In the exemplary embodiment depicted in FIG. 13, the conversion layer 4 is applied directly to the substrate 21 in the interior of the LED 20. In the exemplary embodiment depicted in FIG. 14, the conversion layer is also disposed in the interior of the LED 20, but this time on a side of the organic luminescing layer 24 that faces away from the substrate 21. For example, the conversion layer 4 is disposed between the second electrode layer 22 and the encapsulant 25. In the exemplary embodiment depicted in FIG. 16, a conversion layer 4 is applied to an outer face of the substrate 21 that faces the interior of the LED 20.

The conversion layer 4 has, for example, a thickness of less than or equal to 5 µm. It is, for example, flexible and can be applied in the form of a film over a large area in the interior of an LED or to an outer face of the LED. This is particularly suitable for flexible organic LEDs intended, for example, for placement on uneven surfaces or for roll-up displays or lighting units. The use of phosphors in the form of nanoparticles makes the production of such thin conversion layers 4 practicable for the first time. In organic LEDs, which are usually configured as very thin, the thickness is therefore advantageously increased only insubstantially by the conversion layer 4.

Figure 15:
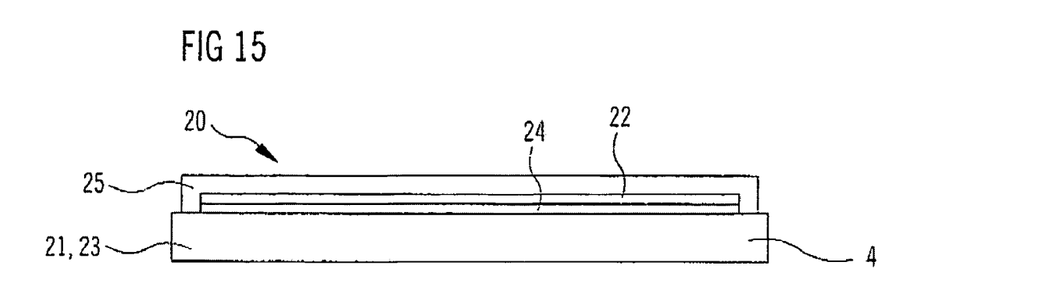
FIG. 15 is a schematic sectional view of a tenth light-emitting optical component comprising a wavelength-converting converter material.
Figure 16:
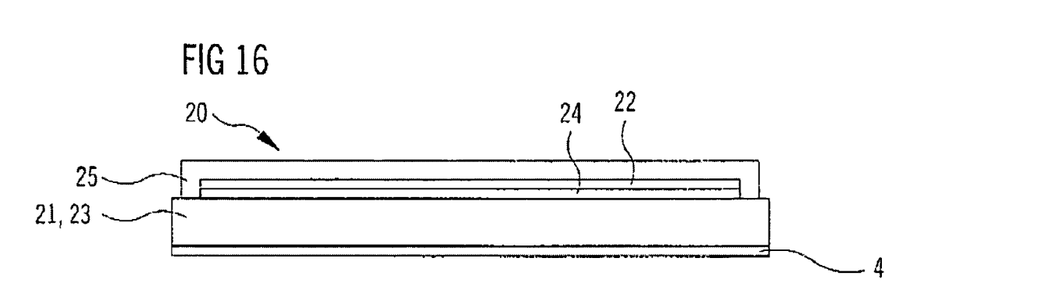
FIG. 16 is a schematic sectional view of an eleventh light-emitting optical component comprising a wavelength-converting converter material.

The exemplary embodiment illustrated in FIG. 15 is similar to the exemplary embodiment described above in connection with FIG. 12. One difference is that the substrate 21 simultaneously also functions as an electrode layer 23. The substrate in this case is, for example, a polymer electrode substrate, which unlike conventional polymer electrode substrates has phosphor particles incorporated into it. Substrate 21 thus acts at least in part both as an electrode and as a conversion layer 4.

The light-emitting optoelectronic components described in the exemplary embodiments are intended, for example, to be used in general lighting applications. The wavelength ranges of the primary radiation sources and of the phosphors used and the mixing ratio of electromagnetic radiation having different wavelength ranges are coordinated with each other to yield a resulting color space of the component that is desirable for general lighting purposes. The resulting color space is, in particular, perceptible as white light, it also being possible for this light to show a given color tint, for example a reddish or yellowish tint, depending on the type of application.

The resulting color space can be adjusted very exactly by the specified methods, since the converting properties of the conversion layer can be controlled and adjusted very precisely owing to the very small thickness of the conversion layer and the use of at least one phosphor in the form of nanoparticles. The color space is measured in each case in the main radiation direction of the particular component. Components that are produced according to the methods explained hereinabove with reference to FIGS. 9 to 11 and are intended for the same color space in the CIE color chart have values for the x and y coordinates of the resulting color spaces that are within an interval of 0.03 or less with a statistical certainty of at least 95%, for example 97%.

The phosphor particles or agglomerates of phosphor particles are so selected and arranged that they convert electromagnetic radiation from a range of between 360 nm inclusive and 500 nm or 520 nm to a longer-wave radiation in such a way that the requisite brightness and the necessary uniform illumination pattern can be obtained by precise adjustment the resulting color space. This applies in particular to use in the general lighting field, in which high-power LEDs are operated with an electrical output of, for example, up to 100 mW. The phosphors in the form of nanoparticles have broadened absorption bands, a higher optical transparency and much shorter decay times after stimulation than phosphor particles with diameters in the micrometer range. This makes it possible to produce conversion elements that meet high requirements, particularly in the area of general lighting, and that can be economically produced. A further advantage of phosphors in the form of nanoparticles is that they have a much larger surface area, assuming equal volume, than phosphor particles with diameters in the micrometer range, thus making for improved emission behavior. In addition, phosphors in the form of nanoparticles exhibit smaller variations in particle surface than larger phosphor particles, i.e., they may have more regular surfaces. Their emission behavior can also be advantageously influenced by this factor.

The converter materials and conversion layers described here have advantages over conventional phosphors and phosphor particles. Surface interactions between phosphor particles can be reduced, leading to more uniform distributions of the phosphor in the particular matrix material. Using phosphors in the form of nanoparticles makes it possible to significantly reduce or to eliminate optical extinctions, losses of transparency and associated losses of brightness, major shifts in color space or unacceptable color-space tolerances, and nonuniform illumination patterns. With the use of nanoparticles, in contrast to the conventionally used phosphor particles, effective conversion layers no more than 50 µm thick, or even less than 5 µm thick, can be realized technically with reasonable expenditure.

Furthermore, the use of phosphors in the form of nanoparticles makes it possible to systematically produce phosphor agglomerates of very small extent. With conventional phosphors, by contrast, for one thing the formation of agglomerates is undesirable, and for another, additional technical expenditure is usually necessary to prevent the formation of agglomerates with an extent of 20 µm or less.

With phosphors in the form of nanoparticles, much shorter decay times of saturation and reabsorption effects and smaller temperature-induced shifts in the phosphor emission spectrum can be obtained than with conventionally used phosphors. This is advantageous particularly in conjunction with the use of high-power LEDs in the general lighting field. The LEDs have, for example, an electrical output of up to 100 mW.

If white light is to be produced for general lighting applications using LEDs, very tight tolerances are required for the x and y coordinates of the CIE chart, i.e., for the color space. Such tight tolerances can be realized satisfactorily using phosphors in the form of nanoparticles, whereas with conventional phosphors this is possible at present only with high technical expenditure, additional cost, and a high reject rate. Anisotropic optical stimulus and emission processes that may occur in conventional phosphors can also be kept to a minimum. Increased uniformity throughout the solid angle in which the electromagnetic radiation is emitted can be achieved in this way.

One important reason for the difficulty of achieving tight color-space tolerances using conventional phosphor particles is an unfavorable overlap of conventional phosphor absorption spectra, on the one hand, and of emission spectra of InGaN-based or GaN-based LED chips, on the other. The absorption spectrum and the emission spectrum usually overlap only within a narrow range, so even slight shifts in at least one of these spectra can have a major impact on the collectively realized color space. In particular, the usual production-related variations in the wavelength of the emission spectrum of LED chips lead to sharp color-space variations and nonuniform illumination patterns for corresponding components provided with the LED chip and converter material.

In the case of conventionally used phosphor particles, the absorption spectrum depends significantly, inter alia, on the grain size of the phosphor particles, which is subject to relatively wide scatter. This dependency may be less marked in the case of phosphors in the form of nanoparticles. In addition, with nanoparticles it is possible to produce well-defined grain sizes in a reproducible manner.

Phosphors in the form of nanoparticles often have a more regular particle shape than conventional phosphor particles with diameters in the micrometer range. Nanophosphors have a much higher surface-to-volume ratio because of their small size, so light absorption can theoretically be increased due to the large surface area, and longer-wave emission from the phosphor surface can take place with less interference because of the lower degree of interaction at the surface. In addition, nanophosphors make it possible to fabricate higher-transparency converter materials, which reduce light losses in the converter element.

Phosphors in the form of nanoparticles can also exhibit less temperature dependence in phosphor emission, broader absorption bands with higher light absorption (A. E. Absorption Efficiency) and shorter decay times, so as to reduce saturation and self-absorption effects.

The CIE color space of the mixed light from light-emitting components comprising converter materials can in particular be deliberately controlled and precisely adjusted via the choice and combination of phosphors, the phosphor concentration or concentrations in the matrix material, and, where applicable, the layer thickness of the conversion layer.

The explication of the invention with reference to the above-described components naturally is not to be construed as limiting the invention thereto. The semiconductor body, such as for example an LED chip or a laser diode chip, is also to be understood for example as a polymer LED or an organic LED emitting a corresponding spectrum of radiation. The invention encompasses every novel feature and every combination of features, including in particular any combination of features recited in the claims, even if that feature or combination itself is not explicitly mentioned in the claims or exemplary embodiments.

The invention claimed is:

1. A wavelength-converting converter material, comprising:
   a first wavelength-converting phosphor comprising phosphor particles, wherein a portion of the first phosphor or all of the first phosphor is present in the form of nanoparticles, the nanoparticles having a d50-value being greater than or equal to 1 nm and less than or equal to 100 nm, said d50-value being a median particle diameter which is determined on the basis of a volume or mass distribution sum (Q3) or a number distribution sum (Q0); and
   a second wavelength-converting phosphor comprising microparticles having a median particle diameter (d50-value) being greater than 1 μm and less than or equal to 20 μm;
   wherein the nanoparticles serve as an optically active thixotropic agent or as an optically active sedimentation delaying agent for the microparticles.

2. The wavelength-converting converter material as in claim 1, characterized in that said nanoparticles have a $d_{50}$ value measured in $Q_3$ that is greater than or equal to 1 nm and less than or equal to 100 nm or said nanoparticles have a $d_{50}$ value measured in $Q_0$ that is greater than or equal to 1 nm and less than or equal to 100 nm, wherein the $d_{50}$ value measured in $Q_3$ is the median particle diameter of a cumulative volume distribution of said nanoparticles and the $d_{50}$ value measured in $Q_0$ is the median particle diameter of a cumulative number distribution of said nanoparticles.

3. The wavelength-converting converter material as in claim 1, characterized in that said nanoparticles have a $d_{50}$ value measured in $Q_3$ that is greater than or equal to 1 nm and less than or equal to 30 nm or said nanoparticles have a $d_{50}$ value measured in $Q_0$ that is greater than or equal to 1 nm and less than or equal to 30 nm, wherein the $d_{50}$ value measured in $Q_3$ is the median particle diameter of a cumulative volume distribution of said nanoparticles and the $d_{50}$ value measured in $Q_0$ is the median particle diameter of a cumulative number distribution of said nanoparticles.

4. The wavelength-converting converter material as in claim 1, characterized in that said nanoparticles are partially or completely aggregated into agglomerates having a $d_{50}$ measured in $Q_3$ that is greater than or equal to 1 nm and less than or equal to 100 nm or said nanoparticles have a $d_{50}$ value measured $Q_0$ that is greater than or equal to 1 nm and less than or equal to 100 nm, wherein the $d_{50}$ value measured in $Q_3$ is the median particle diameter of a cumulative volume distribution of said nanoparticles and the $d_{50}$ value measured in $Q_0$ is the median particle diameter of a cumulative number distribution of said nanoparticles.

5. The wavelength-converting converter material as in claim 1, characterized in that said converter material comprises at least one of the materials epoxy casting resin, epoxy resin molding compound, acrylate, silicone and thermoplastic.

6. The wavelength-converting converter material as in claim 5, characterized in that said converter material includes at least one hybrid material comprising silicone and at least one of the materials epoxy resin and acrylate.

7. The wavelength-converting converter material as in claim 5, characterized in that said converter material comprises at least one thermoplastic from the group consisting of poly-N-methyl methacrylimide (PMMI), polycarbonates (PC), polyamides (PA), polystyrene (PS), and cycloolefinic polymers (COP) and copolymers (COC).

8. The wavelength-converting converter material as in claim 1, characterized in that said converter material comprises at least one inorganic matrix material.

9. The wavelength-converting converter material as in claim 1, characterized in that a portion of the first phosphor is present in the form of nanoparticles and the first phosphor additionally comprises phosphor particles having a $d_{50}$ value measured in $Q_3$ or a $d_{50}$ value measured in $Q_0$ of greater than 0.1 μm and less than or equal to 25 μm, or said converter material comprises another phosphor having such phosphor particles, wherein the $d_{50}$ value measured in $Q_3$ is the median particle diameter of a cumulative volume distribution of said nanoparticles and the $d_{50}$ value measured in $Q_0$ is the median particle diameter of a cumulative number distribution of said nanoparticles.

10. The wavelength-converting converter material as in claim 1, characterized in that a portion of the first phosphor is present in the form of nanoparticles and the first phosphor additionally comprises phosphor particles having a $d_{50}$ value measured in $Q_3$ that is greater than or equal to 5 μm and less than or equal to 20 μm or said nanoparticles have a $d_{50}$ value measured in $Q_0$ of greater than or equal to 5 μm and less than or equal to 20 μm, or said converter material comprises another phosphor having such phosphor particles, wherein the $d_{50}$ value measured in $Q_3$ is the median particle diameter of a cumulative volume distribution of said nanoparticles and the $d_{50}$ value measured in $Q_0$ is the median particle diameter of a cumulative number distribution of said nanoparticles.

11. The wavelength-converting converter material as in claim 5, characterized in that said converter material comprises at least one addition-crosslinking silicone.

12. The wavelength-converting converter material as in claim 11, characterized in that said silicone is thermally or photonically curing.

13. The wavelength-converting converter material as in claim 1, characterized in that the first phosphor contains at least phosphor particles from the group of rare-earth-doped garnets, rare-earth-doped thiogallates, rare-earth-doped aluminates or rare-earth-doped orthosilicates or contains phosphor particles having oxidic host lattices with at least one activator from the group formed of the rare earths, Mn, Ag and Cr.

14. The wavelength-converting converter material as in claim 1, characterized in that the first phosphor particles comprise, as activator ions, elements of the lanthanide series, manganese, chromium, silver or uranyl.

15. The wavelength-converting converter material as in claim 1, characterized in that it comprises at least two different phosphors, which are present partially or completely in the form of nanoparticles.

16. The wavelength-converting converter material as in claim 1, characterized in that it comprises at least two different phosphors, only one of which is in the form of nanoparticles.

17. The wavelength-converting converter material as in claim 1, characterized in that it comprises at least one inorganic phosphor in the form of nanoparticles and at least one organic phosphor.

18. The wavelength-converting converter material as in claim 1, characterized in that it comprises optically non-stimulatable scattering particles having a $d_{50}$ value measured in $Q_3$ that is greater than or equal to 100 nm and less than or equal to 10 μm or said nanoparticles have a $d_{50}$ value measured in $Q_0$ of greater than 100 nm and less than or equal to 10 μm, wherein the $d_{50}$ value measured in $Q_3$ is the median particle diameter of a cumulative volume distribution of said nanoparticles and the $d_{50}$ value measured in $Q_0$ is the median particle diameter of a cumulative number distribution of said nanoparticles.

19. The wavelength-converting converter material as in claim 1, characterized in that at least one phosphor is present that has a host lattice in which at least two different elements are present simultaneously as activator.

20. The wavelength-converting converter material as in claim 1, characterized in that said converter material comprises at least one reaction resin that contains, as an epoxy casting resin formulation, at least one storage-stable curing agent formulation.

21. The wavelength-converting converter material as in claim 20, characterized in that said curing agent formulation comprises one or more of the substances carboxylic acid anhydrides with acid esters (carboxylic acid anhydride half esters), flexibilizers, organic phosphorus compounds, initiators and accelerators.

22. The wavelength-converting converter material as in claim 20, characterized in that said curing agent formulation comprises at least one complex compound of the colorless $Zn^{2+}$ ion as accelerator.

23. The wavelength-converting converter material as in claim 22, characterized in that said complex compound of the colorless $Zn^{2+}$ ion comprises organic ion ligands.

24. The wavelength-converting converter material as in claim 22, characterized in that said curing agent formulation comprises zinc octoate as accelerator.

25. The wavelength-converting converter material as in claim 22, characterized in that said complex compound has a $Zn^{2+}$ content of greater than 10 wt %.

26. The wavelength-converting converter material as in claim 22, characterized in that said complex compound has a $Zn^{2+}$ content of greater than or equal to 21 wt %.

27. The wavelength-converting converter material as in claim 1, characterized in that said converter material is present partially or completely as a layer.

28. The wavelength-converting converter material as in claim 27, characterized in that said layer has a thickness of less than or equal to 50 μm.

29. The wavelength-converting converter material as in claim 27, characterized in that said layer has a thickness of less than or equal to 5 μm.

30. A wavelength-converting converter material, comprising:
a first wavelength-converting phosphor comprising phosphor particles, wherein a portion of the first phosphor or all of the first phosphor is present in the form of nanoparticles, the nanoparticles having a d50-value being greater than or equal to 1 nm and less than or equal to 100 nm, said d50-value being a median particle diameter which is determined on the basis of a volume or mass distribution sum (Q3) or a number distribution sum (Q0); and
a second wavelength-converting phosphor comprising microparticles having a median particle diameter (d50-value) being greater than 1 μm and less than or equal to 20 μm;
wherein the nanoparticles serve as an optically active thixotropic agent or as an optically active sedimentation delaying agent for the microparticles
wherein said converter material is present as a film.

* * * * *